US006563351B2

United States Patent
Onizawa et al.

(10) Patent No.: US 6,563,351 B2
(45) Date of Patent: May 13, 2003

(54) SEMICONDUCTOR INTEGRATED CIRCUIT HAVING OUTPUT BUFFER

(75) Inventors: Tadashi Onizawa, Yokohama (JP); Natsuki Kushiyama, Kawasaki (JP); Masaru Koyanagi, Yokohama (JP); Katsuki Matsudera, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/965,951

(22) Filed: Sep. 27, 2001

(65) Prior Publication Data

US 2002/0041194 A1 Apr. 11, 2002

(30) Foreign Application Priority Data

Sep. 28, 2000 (JP) ........................................ 2000-296826

(51) Int. Cl.[7] .................................................. H03B 1/00
(52) U.S. Cl. ....................................... 327/108; 327/111
(58) Field of Search ................................ 327/108, 111, 327/427; 323/269, 280, 281, 282

(56) References Cited

U.S. PATENT DOCUMENTS 4,796,174 A * 1/1989 Nadd ........................... 363/60
6,049,200 A * 4/2000 Hayashimoto ............... 323/269
6,163,176 A * 12/2000 Baschirotto et al. ........ 327/108
6,351,159 B1 * 2/2002 Huber et al. ................. 327/108

* cited by examiner

Primary Examiner—Timothy P. Callahan
Assistant Examiner—Linh Nguyen
(74) Attorney, Agent, or Firm—Gray Cary Ware & Freidenrich LLP

(57) ABSTRACT

A semiconductor integrated circuit includes first and second MOS transistors and a capacitor. The first MOS transistor has a drain connected to an output terminal, a gate and a source. The second MOS transistor has a gate, a drain connected to the source of the first MOS transistor and a source and has the same conductivity type as the first MOS transistor. The capacitor has one electrode connected to the gate of the first MOS transistor and the other electrode connected to a node whose potential changes in a complementary fashion with respect to the drain potential of the first MOS transistor and functions to cancel out an influence, caused by the coupling of a mirror capacitor which exists between the gate and drain of the first MOS transistor, affecting the gate potential of the first MOS transistor.

22 Claims, 14 Drawing Sheets

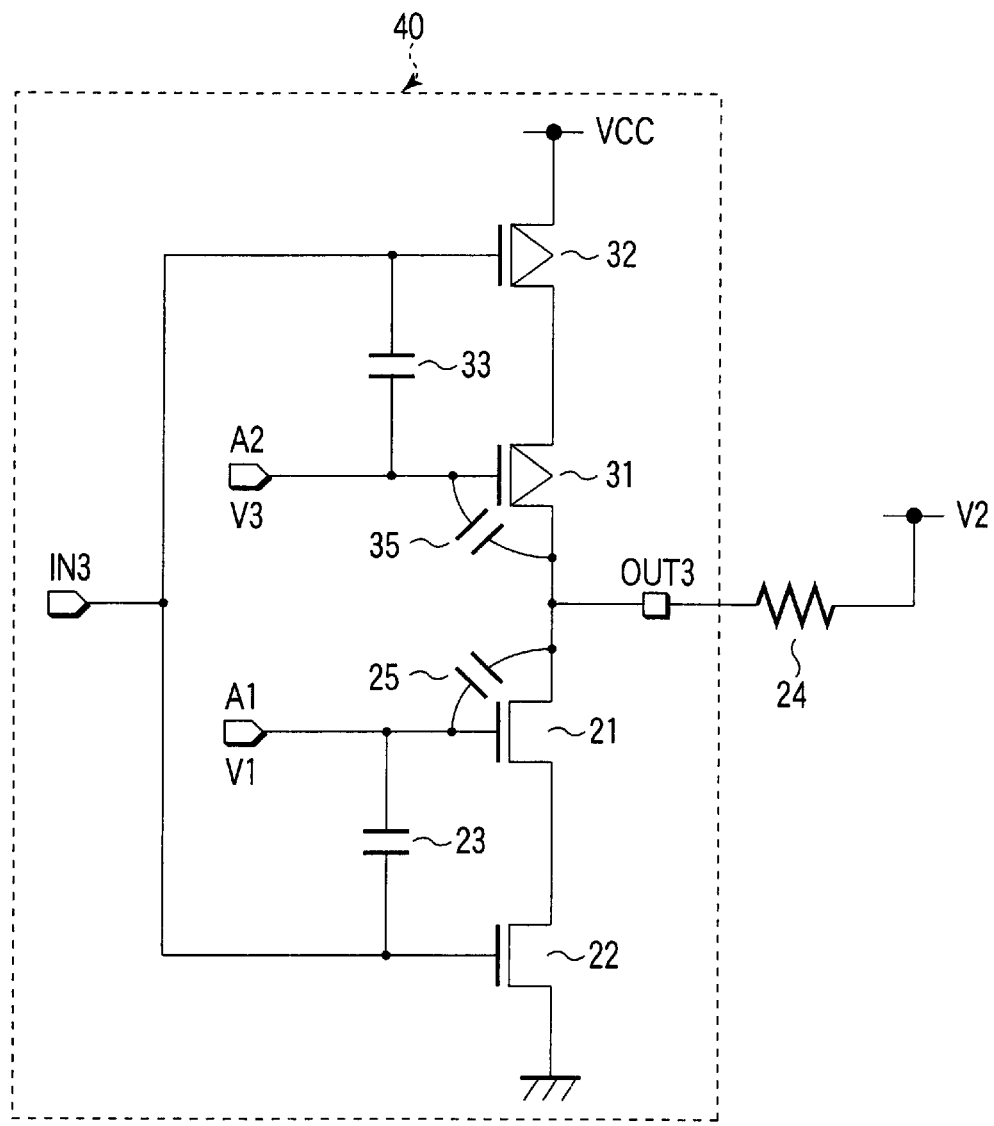
F I G. 7

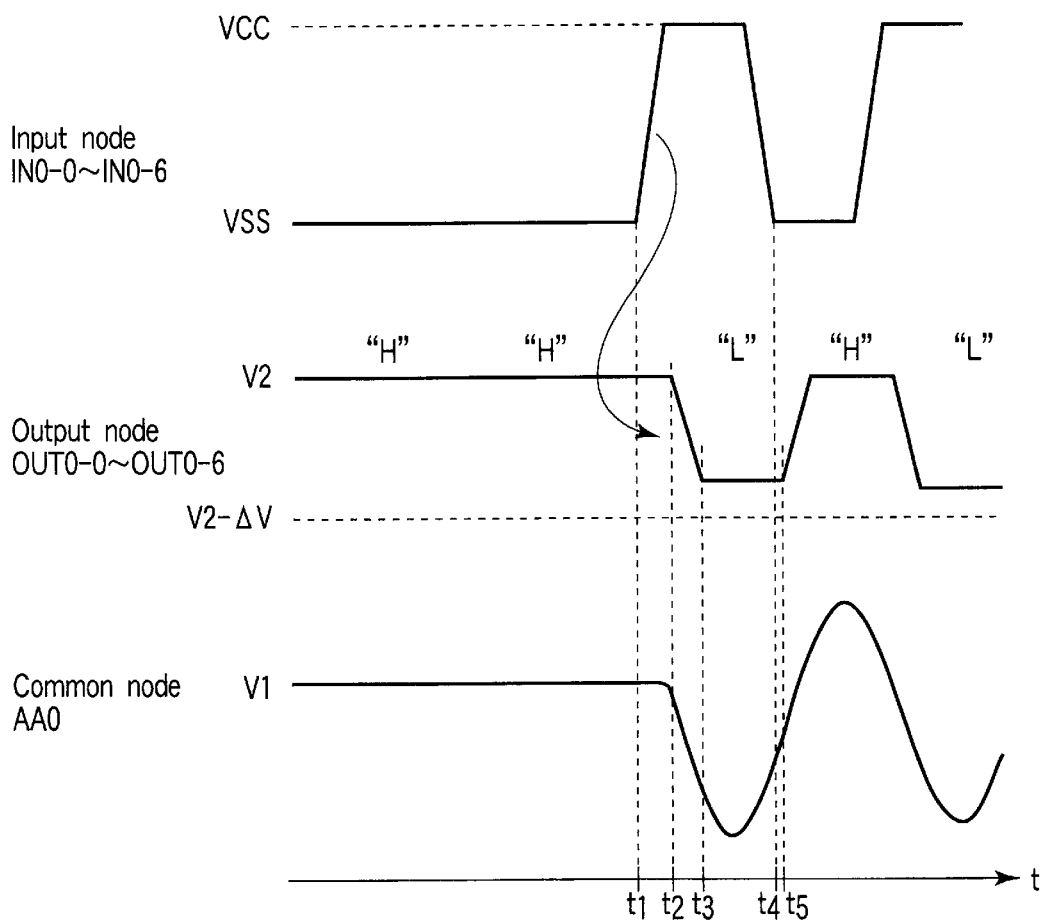
F I G. 10A

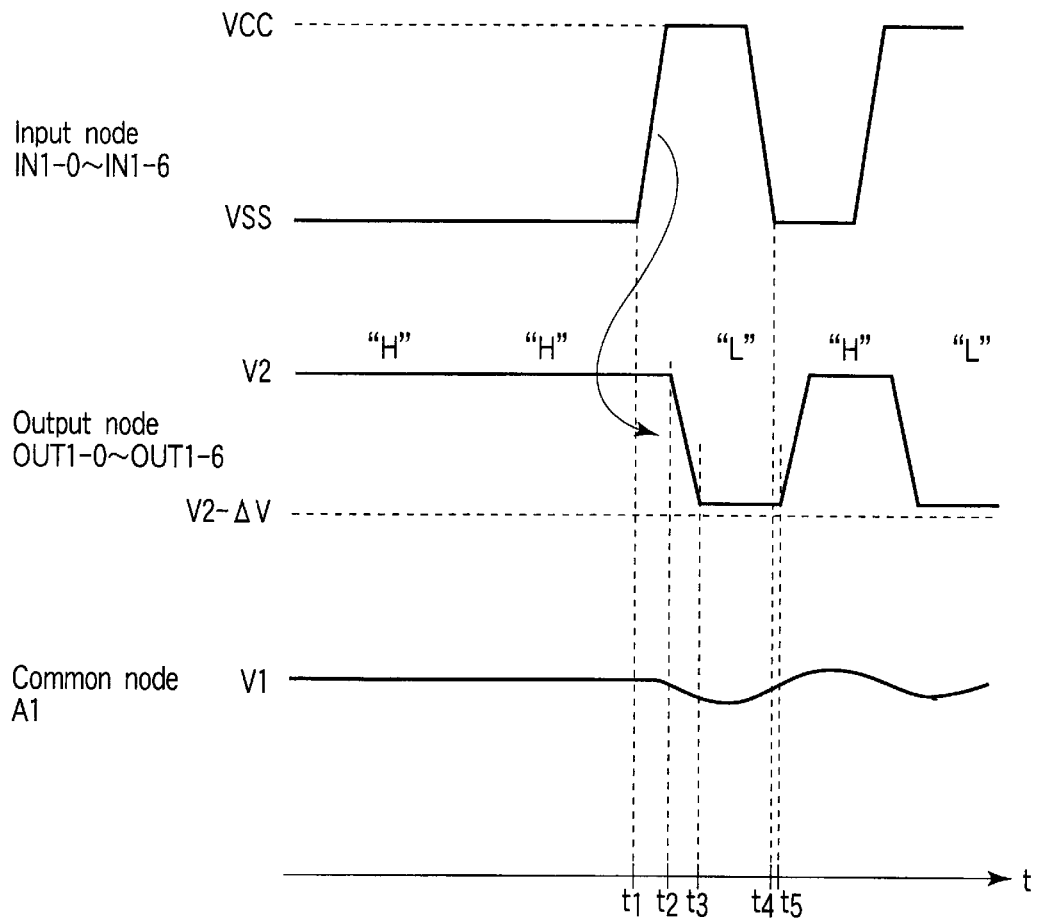
F I G. 11A

SEMICONDUCTOR INTEGRATED CIRCUIT HAVING OUTPUT BUFFER

CROSS-REFERENCE TO RELATED APPLICATIONS

This application is based upon and claims the benefit of priority from the prior Japanese Patent Application No. 2000-296826, filed Sep. 28, 2000, the entire contents of which are incorporated herein by reference.

BACKGROUND OF THE INVENTION

1. Field of the Invention

This invention relates to a semiconductor integrated circuit and more particularly to a semiconductor integrated circuit used in a buffer circuit of a semiconductor memory which is operated according to a high frequency clock.

2. Description of the Related Art

Recently, the processing capability of computers has been highly enhanced and the study of semiconductor memory devices which can be operated at high speed is being actively pursued. Further, the frequency of a signal transferred between the semiconductor memory which can be operated at high speed and a controller for controlling the semiconductor memory is enhanced and the amplitude thereof is reduced. Therefore, it becomes important to study how to realize an output level and output timing of an output buffer for outputting a signal from the semiconductor memory in accordance with the design.

A conventional output buffer is explained with reference to FIG. 1A. FIG. 1A is a circuit diagram showing an open-drain type output buffer using MOS transistors.

As shown in FIG. 1A, an output buffer 10 includes n-channel MOS transistors 11, 12 and capacitor element 13. The MOS transistor 11 has a gate connected to a node A0, a source and a drain connected to an output node OUT0 of the output buffer 10. The MOS transistor 12 has a gate connected to an input node IN0, a source connected to a ground potential and a drain connected to the source of the MOS transistor 11. The capacitor element 13 has one end connected to the gate of the MOS transistor 11 and the other end connected to the ground potential. The node A0 is applied with voltage V1.

The output node OUT0 of the output buffer 10 is connected to one end of a load element 14 and the other end of the load element is connected to a power supply potential V2. A capacitor 15 is a mirror capacitor parasitically existing between the gate and drain of the MOS transistor 11.

Generally, a semiconductor integrated circuit includes a plurality of output buffers having the same construction as the output buffer 10. The plurality of output buffers output data items independently held therein at the same timing. The semiconductor integrated circuit is explained with reference to FIG. 1B. FIG. 1B is a block diagram showing the semiconductor integrated circuit.

As shown in FIG. 1B, the semiconductor integrated circuit includes seven output buffers 10-0 to 10-6 with the same construction as that shown in FIG. 1A. Nodes A0-0 to A0-6, output nodes OUT0-0 to OUT0-6 and input nodes IN0-0 to IN0-6 of the output buffers 10-0 to 10-6 respectively correspond to the node A0, output node OUT0 and input node IN0 shown in FIG. 1A. The nodes A0-0 to A0-6 are commonly connected. The commonly connected node AA0 is applied with voltage V1. Further, the output nodes OUT0-0 to OUT0-6 are respectively connected to one-side ends of load elements 14-0 to 14-6. The other ends of the load elements 14-0 to 14-6 are connected to a power supply voltage V2. Further, independent switching signals are input to the input nodes IN0-0 to IN0-6.

BRIEF SUMMARY OF THE INVENTION

A semiconductor integrated circuit according to an aspect of the present invention comprises a first MOS transistor having a drain connected to an output terminal, a gate and a source, the gate of the first MOS transistor being applied with voltage not lower than a threshold voltage of the first MOS transistor; a second MOS transistor having a gate supplied with a switching signal used for controlling an output level of the output terminal, a drain connected to the source of the first MOS transistor and a source, the second MOS transistor having the same conductivity type as the first MOS transistor; a first capacitor having one electrode connected to the gate of the first MOS transistor and the other electrode connected to a first node whose potential changes in a complementary fashion with respect to the drain potential of the first MOS transistor, the first capacitor functioning to cancel out an influence, caused by the coupling of the mirror capacitor existing between the gate and drain of the first MOS transistor, affecting the gate potential of the first MOS transistor; and a first inverter having an input terminal connected to the gate of said second MOS transistor and an output terminal connected to the other electrode of the first capacitor.

BRIEF DESCRIPTION OF THE SEVERAL VIEWS OF THE DRAWING

FIG. 7 is a circuit diagram showing a semiconductor integrated circuit according to a fourth embodiment of the present invention;

FIGS. 10A and 10B are output waveform diagrams showing output waveforms of respective nodes in the semiconductor integrated circuit shown in FIG. 1B;

FIGS. 11A and 11B are output waveform diagrams showing output waveforms of respective nodes in the semiconductor integrated circuit shown in FIG. 9.

DETAILED DESCRIPTION OF THE INVENTION

Figure 2A:
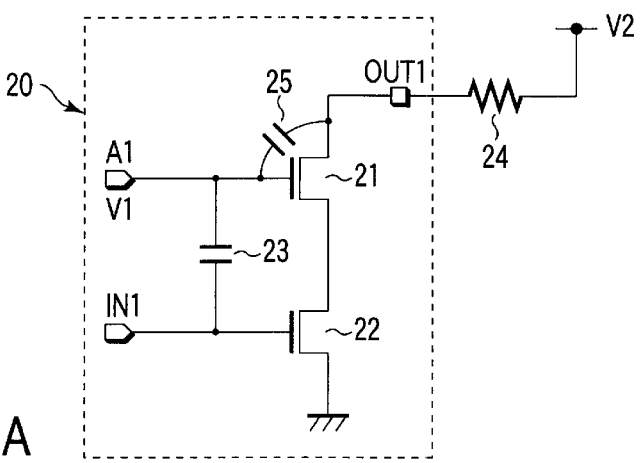
FIG. 2A is a circuit diagram showing a semiconductor integrated circuit according to a first embodiment of the present invention.

There will now be described a semiconductor integrated circuit according to a first embodiment of this invention with reference to FIG. 2A. FIG. 2A is a circuit diagram showing a semiconductor integrated circuit including an open-drain type output buffer.

As shown in FIG. 2A, an output buffer 20 includes n-channel MOS transistors 21, 22 and capacitor element 23. The MOS transistor 21 has a gate connected to a node A1, a drain connected to an output node OUT1 of the output buffer 20 and a source. The MOS transistor 22 has a gate connected to an input node IN1, a source connected to a ground potential and a drain connected to the source of the MOS transistor 21. The capacitor element 23 has one end connected to the gate of the MOS transistor 21 and the other end connected to the gate of the MOS transistor 22.

The output node OUT1 of the output buffer 20 is connected to one end of a load element 24 and the other end of the load element is connected to power supply voltage V2. A capacitor 25 is a mirror capacitor parasitically existing between the gate and drain of the MOS transistor 21.

Next, the operation of the output buffer 20 with the above construction is explained. The potential of the node A1 is fixed at internal voltage V1. Therefore, the MOS transistor 21 is set in the ON state. The input node IN1 is supplied with a switching signal of "High" or "Low" level. The output level of the output buffer 20 is switched according to the level of the switching signal. Specifically, when the switching signal is set at the "Low" level (VSS), the MOS transistor 22 is set into the OFF state, and as a result, an output of the output node OUT1 is set to the "High" level (V2). On the other hand, when the switching signal is set at the "High" level (VCC), the MOS transistor 22 is set into the ON state. Therefore, a current flows from the output node OUT1 towards the source of the MOS transistor 22. As a result, the output of the output node OUT1 is set to the "Low" level (V2−ΔV). ΔV indicates a voltage drop amount in the load element 24.

The potential of the node OUT1 when the output of the output buffer is set at the "Low" level is substantially determined by the current supplied by the MOS transistor 21. The current amount is determined by the potential of the node A1 and the potential is given by a voltage generator (not shown). Therefore, the voltage generator strictly controls the potential of the node A1 so as to always set the potential of the node A1 at the internal potential V1.

Figure 2B:
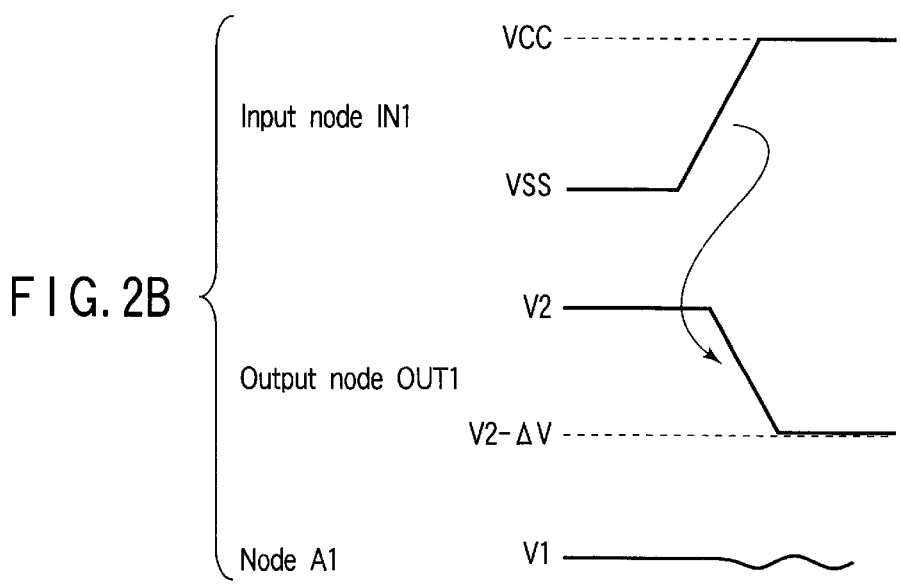
FIG. 2B is an output waveform diagram showing output waveforms of respective nodes in the semiconductor integrated circuit shown in FIG. 2A.

Changes in the waveforms of the potentials of the respective nodes at the operation time of the output buffer is explained with reference to FIG. 2B. FIG. 2B is a waveform diagram showing the potentials at the input node IN1, output node OUT1 and node A1.

Assume now that the switching signal input to the input node IN1 is changed from the "Low" level to the "High" level in the output buffer shown in FIG. 2A. Then, the MOS transistor 21 is set into the ON state and the potential of the output node OUT1 is set to the "Low" level. If the potential of the output node OUT1 (the drain potential of the MOS transistor 21) is lowered ("Low" level), the coupling of the mirror capacitor 25 parasitically existing in the MOS transistor 21 acts to lower the potential of the node A1. On the other hand, if the potential of the input node IN1 rises ("High" level), the coupling of the capacitor element 23 acts to raise the potential of the node A1. Therefore, by adequately determining the capacitance of the capacitor element 23, a lowering in the potential of the node A1 caused by the coupling of the mirror capacitor 25 can be canceled by a rise in the potential of the node A1 caused by the coupling of the capacitor element 23. As a result, the potential of the node A1 can be kept substantially constant.

Thus, a variation in the gate potential of the MOS transistor 21 caused by the coupling of the mirror capacitor of the MOS transistor 21 can be suppressed to an extremely small value. Therefore, a current supplied from the MOS transistor 21 can always be kept substantially constant. As a result, the drain potential of the MOS transistor 21, that is, the potential of the output node of the output buffer can be made substantially constant.

Figure 1A:
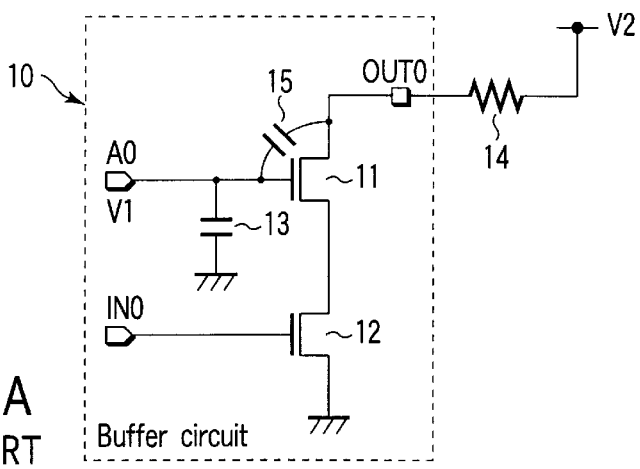
FIGS. 1A and 1B are circuit diagrams showing the conventional semiconductor integrated circuits.
Figure 3A:
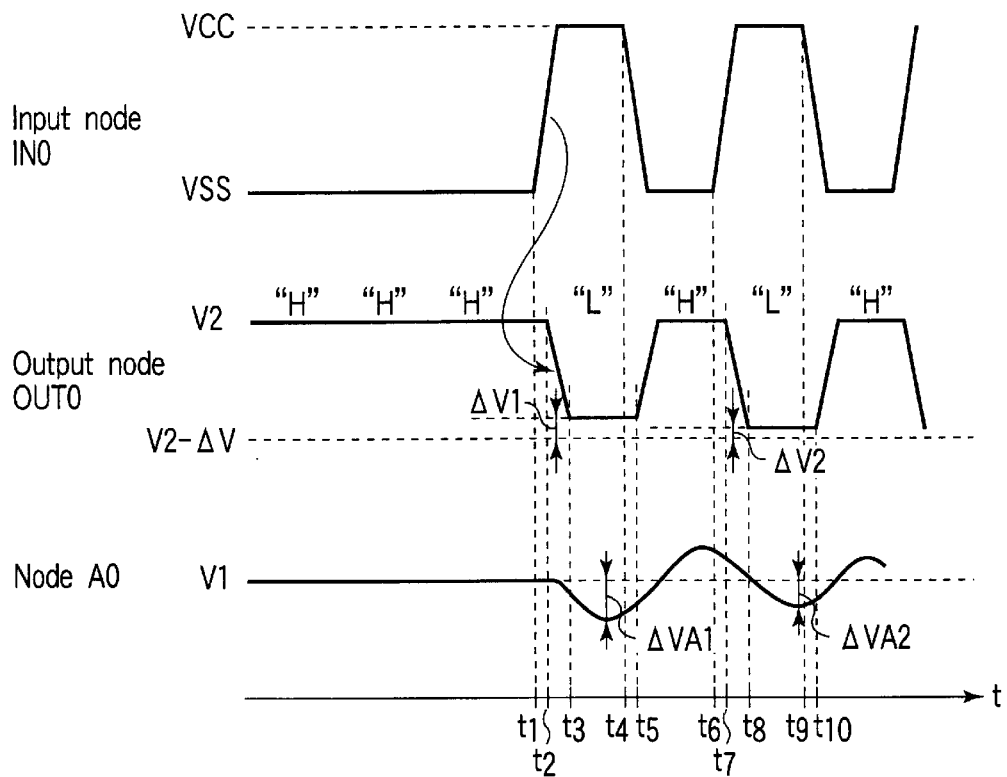
FIG. 3A is an output waveform diagram showing output waveforms of respective nodes in the semiconductor integrated circuit shown in FIG. 1A.
Figure 3B:
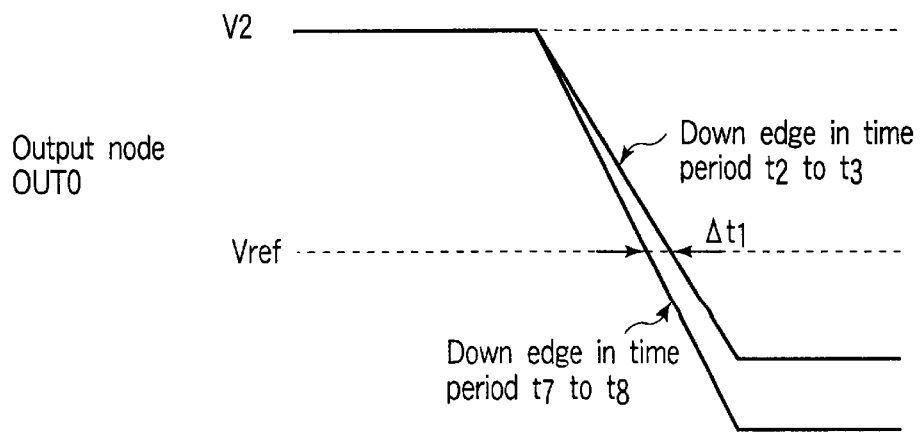
FIG. 3B is an enlarged diagram of the output waveform.
Figure 4:
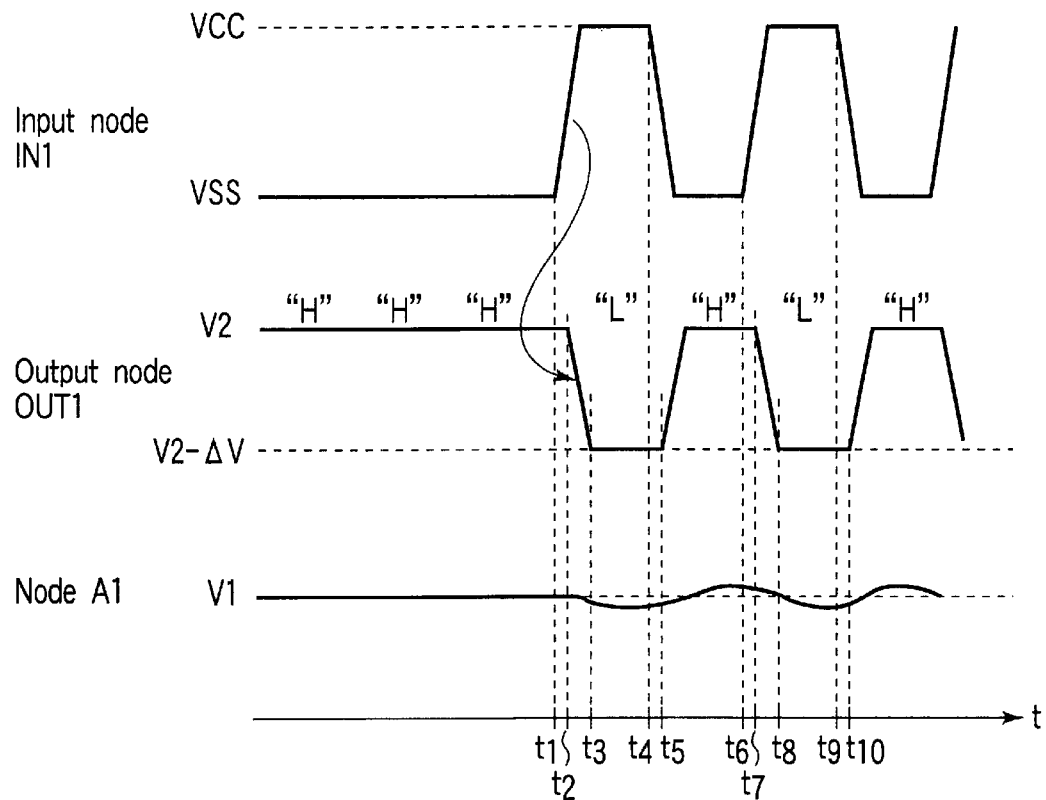
FIG. 4 is an output waveform diagram showing output waveforms of respective nodes in the semiconductor integrated circuit shown in FIG. 2A.

The effect described above significantly appears when the output level of the output node OUT1 rapidly changes. Changes in the potential waveforms of the respective nodes occurring in this case are explained in comparison with a case of the output buffer shown in FIG. 1A. FIG. 3A is a waveform diagram showing potentials of the input node IN0, output node OUT0 and node A0 in the output buffer shown in FIG. 1A, FIG. 3B is a waveform diagram showing a potential variation in the falling portion of an output waveform in the output node OUT0, and FIG. 4 is a waveform diagram showing potentials of the input node IN1, output node OUT1 and node A1 in the output buffer shown in FIG. 2A. FIG. 3A, FIG. 3B and FIG. 4 show a case wherein an output of the output node OUT1 rapidly changes in the order of "High", "High", "High", "Low", "High", "Low", "High" level.

First, variations in the potentials of the respective nodes in the output buffer with the conventional construction are explained with reference to FIG. 3A.

First, assume that an input signal to the input node IN0 rises from the "Low" level (VSS) to the "High" level (VCC) at time t1. Then, the output signal of the output node OUT0 falls from the "High" level (V2) to the "Low" level (GND) at time t2. Since the output signal of the output node OUT0 is kept constant at the "High" level up to the time t2, the potential of the node A0 is stably set at the internal potential V1. However, at the time t2, the potential of the output node OUT0 starts to be lowered. Therefore, the potential of the node A0 starts to be lowered by the coupling of the mirror capacitor 15. A lowering amount of the potential is set as ΔVA1. If the potential of the node A0 becomes lower than the internal potential V1, the current amount flowing in the MOS transistor 11 becomes smaller than a set value. Then, the potential of the output node OUT0 cannot be lowered to (V2−ΔV) which is a set output level when the potential of the node A0 is set at the internal potential V1. As a result, the potential of the output node OUT0 is set at (V2−ΔV+ΔV1) which is higher than the set value by ΔV1.

Next, the input signal to the input node IN0 falls from the "High" level to the "Low" level at time t4. Then, an output signal of the output node OUT0 rises from the "Low" level to the "High" level at time t5. At this time, since the potential of the node A0 is set lower than the internal potential V1 in a time period t2 to t5, the voltage generator supplies charges to the node A0 so as to set the potential of the node A0 to the internal potential V1 (to raise the potential of the node A0). Further, since the potential of the output node OUT0 has been raised, the coupling of the mirror capacitor 13 raises the potential of the node A0. As a result, the potential of the node A0 becomes higher than the internal potential V1.

At time t6 at which the potential of the node A0 is set higher than the internal potential V1, an input signal to the input node IN0 rises from the "Low" level to the "High" level. Then, the output signal of the output node OUT0 falls from the "High" level to the "Low" level at time t7. Therefore, the potential of the node A0 is lowered by the coupling of the mirror capacitor 13. However, since the potential of the node A0 at the time t7 is set higher than the internal potential V1 by supply of charges from the voltage generator and the coupling of the mirror capacitor 13, the potential of the node A0 is set to a potential which is lower than the internal potential V1 by $\Delta VA2$ ($\Delta VA1 > \Delta VA2$). As a result, the potential in a time period between times t8 and t10 and the potential in a time period between the times t3 and t5 are set at the "Low" level, but they are set at different potential levels. More specifically, the potential in a time period between the times t3 and t5 is set at (V2−ΔV+ΔV1) and the potential in a time period between the times t8 and t10 is set at (V2−ΔV+ΔV2).

Of course, the potential variation of the node A0 which is caused by the coupling of the mirror capacitor 13 temporarily occurs and the potential of the node A0 returns to the internal potential V1 after a preset period of time. However, in the high frequency operation of the output buffer, the potential of the node OUT0 changes while the potential of the node A0 is being changed by the coupling. Therefore, even if the potentials are set at the same output level ("Low" or "High" level), they are set at different potential levels depending on the period of time and the potential levels of the output level may become different depending on whether output data changes at high speed or not.

The phenomenon explained with reference to FIG. 3A badly influences the timing of changing of the output signal. This is explained with reference to FIG. 3B by taking a case wherein the output signal falls from the "High" level to the "Low" level as an example.

The time required for the output level of the output node OUT0 to change is kept constant irrespective of the potential of the node A0. That is, time (t2 to t3) required for the potential of the output node OUT0 to change from the potential V2 to the potential (V2−ΔV+ΔV1) and time (t7 to t8) required for the potential of the output node OUT0 to change from the potential V2 to the potential (V2−ΔV+ΔV2) are equal to each other. In this case, a reference potential used as a reference for determining the "High" level and "Low" level is set at Vref. Then, the voltage drop amount in the time period t7 to t8 is larger than the voltage drop amount in the time period t2 to t3. Therefore, the potential of the output node OUT0 reaches the reference voltage Vref earlier in a case where it starts to fall at the time t7 than in a case where it starts to fall at the time t2. That is, the through rate of the output waveform is changed. Thus, there occurs a phenomenon that time required for the output signal of the output node OUT0 to change from the "High" level to the "Low" level is changed according to the potential of the node A0.

However, with the output buffer according to the present embodiment, the above problem can be solved. This is explained with reference to FIG. 2B and FIG. 4.

As explained before with reference to FIG. 2B, in the output buffer according to the present embodiment, the influence of the coupling of the mirror capacitor 25 is canceled by the coupling of the capacitor element 23. Therefore, a variation in the potential of the node A1 caused when the output signal of the output node OUT1 changes from the "High" level to the "Low" level is extremely small. Further, since the potential variation is extremely small, the potential of the node A1 returns to the internal potential V1 in a short period of time. As a result, as shown in FIG. 4, the potential level of the "Low" level output to the output node OUT1 is kept constant in the high-frequency operation of the output buffer. At the same time, the through rate of the output waveform is also kept constant.

As described above, according to the semiconductor integrated circuit of the present embodiment, the output potential and output timing in a case where the circuit is operated based on a high frequency clock can be kept constant in each cycle.

Figure 5A:
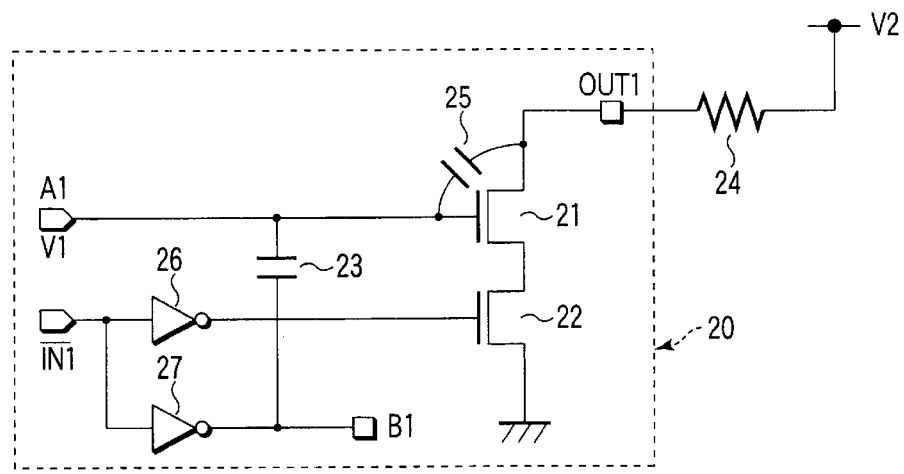
FIG. 5A is a circuit diagram showing a semiconductor integrated circuit according to a second embodiment of the present invention.

Next, a semiconductor integrated circuit according to a second embodiment of the present invention is explained with reference to FIG. 5A. FIG. 5A is a circuit diagram showing a semiconductor integrated circuit including an open-drain type output buffer circuit.

As shown in FIG. 5A, an output buffer 20 includes n-channel MOS transistors 21, 22, capacitor element 23 and inverters 26, 27. The MOS transistor 21 has a gate connected to a node A1, a drain connected to an output node OUT1 of the output buffer 20 and a source. The MOS transistor 22 has a gate connected to an output node of the inverter 26, a source connected to a ground potential and a drain connected to the source of the MOS transistor 21. The capacitor element 23 has one end connected to the gate of the MOS transistor 21 and the other end connected to the output node of the inverter 27. The inverter 26 has an input terminal connected to an input node /IN1 and an output terminal connected to the gate of the MOS transistor 22. The inverter 27 has an input terminal connected to the input node /IN1 and an output terminal connected to a node B1.

The output node OUT1 of the output buffer 20 is connected to one end of a load element 24 and the other end of the load element is connected to power supply voltage V2. A capacitor 25 is a mirror capacitor parasitically existing between the gate and drain of the MOS transistor 21.

Next, the operation of the output buffer 20 with the above construction is explained. The potential of the node A1 is fixed at internal voltage V1. Therefore, the MOS transistor 21 is set in the ON state. The input node /IN1 is supplied with a switching signal of "High" or "Low" level. The output level of the output buffer 20 is switched according to the level of the switching signal. Specifically, when the switching signal is set at the "High" level (VCC), the MOS transistor 22 is set into the OFF state, and as a result, an output of the output node OUT1 is set to the "High" level (V2). On the other hand, when the switching signal is set at the "Low" level (VSS), the MOS transistor 22 is set into the ON state. Therefore, a current flows from the output node OUT1 towards the source of the MOS transistor 22. As a result, an output of the output node OUT1 is set into the "Low" level (V2−ΔV). ΔV indicates a voltage drop amount in the load element 24.

The potential of the output node OUT1 obtained when the output of the output buffer is set at the "Low" level is substantially determined by the current supplied by the MOS transistor 21. The current amount is determined by the potential of the node A1 and the potential is given by a voltage generator. Therefore, the voltage generator strictly controls the potential of the node A1 so as to always set the potential of the node A1 at the internal potential V1.

Figure 5B:
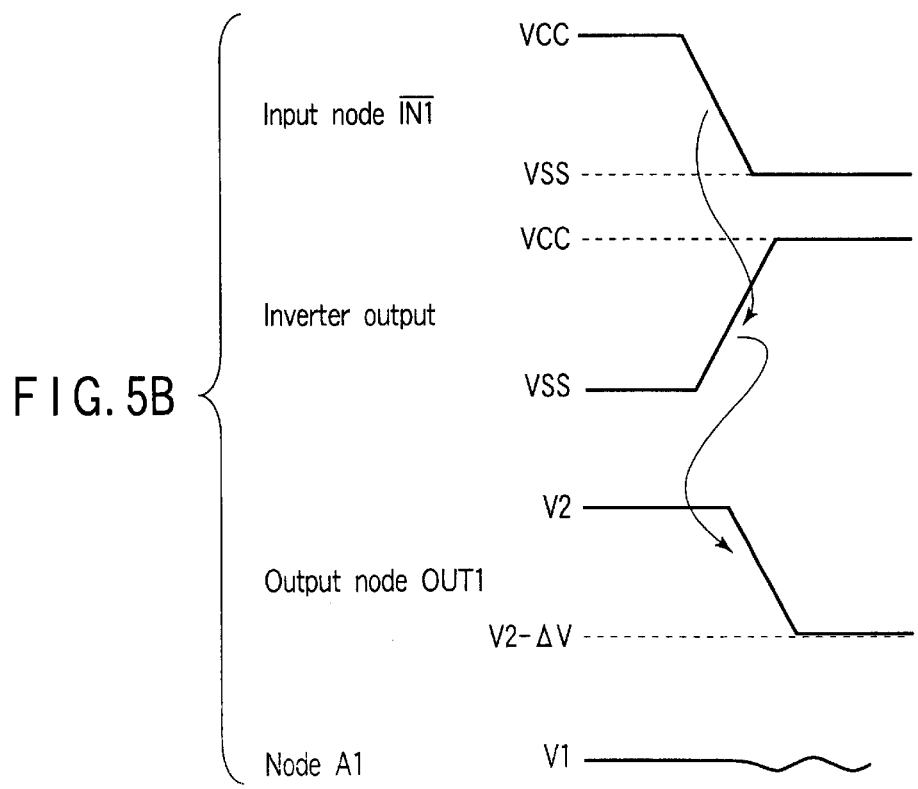
FIG. 5B is an output waveform diagram showing output waveforms of respective nodes in the semiconductor integrated circuit shown in FIG. 5A.

Changes in the waveforms of the potentials of the respective nodes at the operation time of the output buffer are explained with reference to FIG. 5B. FIG. 5B is a waveform diagram showing the potentials of the input node/IN1, the output node of the inverter, the output node OUT1 and the node A1.

Assume now that the switching signal input to the input node/IN1 is changed from the "High" level to the "Low" level in the output buffer shown in FIG. 5A. Then, an output of the inverter 26 changes from the "Low" level to the "High" level. Therefore, the MOS transistor 22 is set into the ON state and the output of the output node OUT1 is set to the "Low" level. Thus, if the potential of the output node OUT1 (the drain potential of the MOS transistor 21) is lowered ("Low" level), the coupling of the mirror capacitor 25 parasitically existing in the MOS transistor 21 acts to lower the potential of the node A1. On the other hand, when the potential of the output node of the inverter 26 rises ("High" level), the coupling of the capacitor element 23 acts to raise the potential of the node A1. Therefore, by adequately determining the capacitance of the capacitor element 23, a lowering in the potential of the node A1 caused by the coupling of the mirror capacitor 25 can be canceled by a rise in the potential of the node A1 caused by the coupling of the capacitor element 23. As a result, the potential of the node A1 can be kept substantially constant.

As described above, the same effect as that obtained in the first embodiment can be attained by use of the construction of FIG. 5A.

In the output buffer according to the present embodiment, the other end of the capacitor element 23 is connected to the node B1. The connection is made to match the timing at which the gate potential of the MOS transistor 21 is lowered by the coupling of the mirror capacitor 25 with the timing at which the gate potential of the MOS transistor 21 is raised by the coupling of the capacitor element 23. That is, in order to permit the influence caused by the coupling of the capacitor element 23 to cancel out the influence caused by the coupling of the mirror capacitor 25, it is required that both of the influences will occur simultaneously in timing. Therefore, in the output buffer according to the present embodiment, the capacitor element 23 is provided between the node A1 and the output node (node B1) of the inverter 27 having adequate size (delay time). Therefore, if the influence caused by the coupling of the mirror capacitor 25 can be canceled, the capacitor element 23 can be provided between the node A1 and the gate of the MOS transistor 22.

Figure 6A:
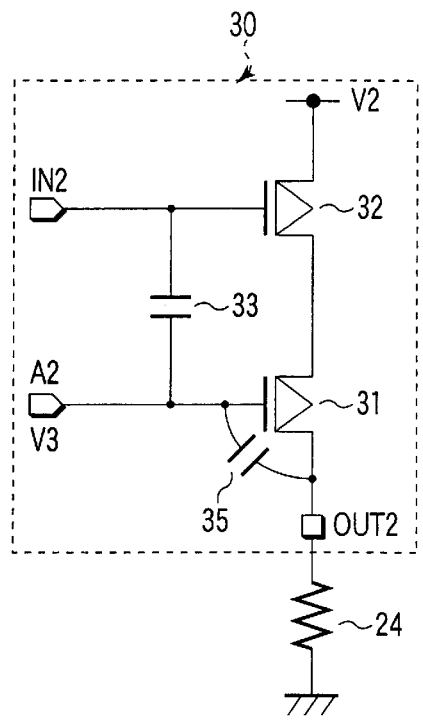
FIG. 6A is a circuit diagram showing a semiconductor integrated circuit according to a third embodiment of the present invention.

Next, a semiconductor integrated circuit according to a third embodiment of the present invention is explained with reference to FIG. 6A. FIG. 6A is a circuit diagram showing a semiconductor integrated circuit including an open-drain type output buffer.

As shown in FIG. 6A, an output buffer 30 includes p-channel MOS transistors 31, 32 and capacitor element 33. The MOS transistor 31 has a gate connected to a node A2, a drain connected to an output node OUT2 of the output buffer 30 and a source. The MOS transistor 32 has a gate connected to an input node IN2, a source connected to a power supply potential V2 and a drain connected to the source of the MOS transistor 31. The capacitor element 33 has one end connected to the gate of the MOS transistor 31 and the other end connected to the gate of the MOS transistor 32.

The output node OUT2 of the output buffer 30 is connected to one end of a load element 24 and the other end of the load element is connected to a ground potential GND. A capacitor 35 is a mirror capacitor parasitically existing between the gate and drain of the MOS transistor 31.

Next, the operation of the output buffer 30 with the above construction is explained. The potential of the node A2 is fixed at internal voltage V3. Therefore, the MOS transistor 31 is set in the ON state. The input node IN2 is supplied with a switching signal of "High" or "Low" level. The output level of the output buffer 30 is switched according to the level of the switching signal. Specifically, when the switching signal is set at the "High" level (VCC), the MOS transistor 32 is set into the OFF state, and as a result, an output of the output node OUT1 is set to the "Low" level (GND). On the other hand, when the switching signal is set at the "Low" level (VSS), the MOS transistor 32 is set into the ON state. Therefore, a current flows from the power supply potential V2 towards the drain of the MOS transistor 31. As a result, an output of the output node OUT2 is set to the "High" level ($\Delta V$). $\Delta V$ indicates a voltage drop amount in the load element 24.

The potential of the output node OUT2 obtained when the output of the output buffer is set at the "High" level is substantially determined by the current supplied by the MOS transistor 31. The current amount is determined by the potential of the node A2 and the potential is given by a voltage generator. Therefore, the voltage generator strictly controls the potential of the node A2 so as to always set the potential of the node A2 at the internal potential V3.

Figure 6B:
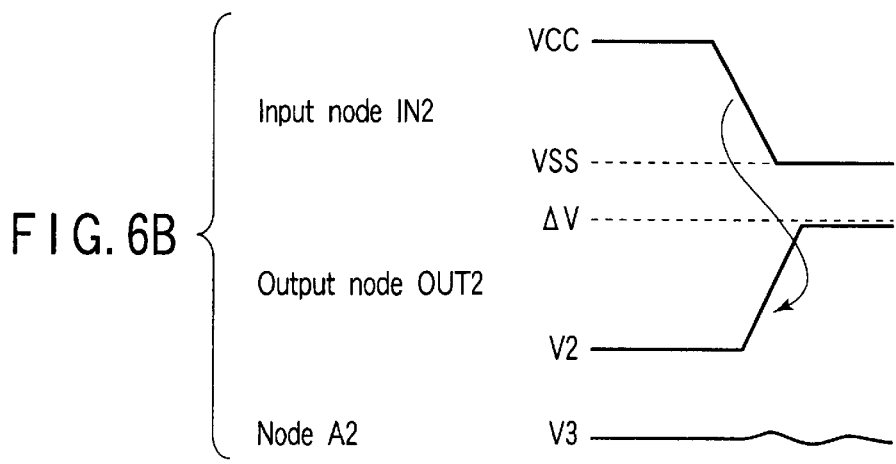
FIG. 6B is an output waveform diagram showing output waveforms of respective nodes in the semiconductor integrated circuit shown in FIG. 6A.

Changes in the waveforms of the potentials of the respective nodes at the operation time of the output buffer are explained with reference to FIG. 6B. FIG. 6B is a waveform diagram showing the potentials of the input node IN2, output node OUT2 and node A2.

Assume now that the switching signal input to the input node IN2 is changed from the "High" level to the "Low" level in the output buffer shown in FIG. 6A. Then, the MOS transistor 32 is set into the ON state and the output of the output node OUT2 is set to the "High" level. Thus, if the potential of the output node OUT2 (the drain potential of the MOS transistor 31) rises ("High" level), the coupling of the mirror capacitor 35 parasitically existing in the MOS transistor 31 acts to raise the potential of the node A2. On the other hand, when the potential of the input node IN2 is lowered ("Low" level), the coupling of the capacitor element 33 acts to lower the potential of the node A2. Therefore, by adequately determining the capacitance of the capacitor element 33, a rise in the potential of the node A2 caused by the coupling of the mirror capacitor 35 can be canceled by a lowering in the potential of the node A2 caused by the coupling of the capacitor element 33. As a result, the potential of the node A2 can be kept substantially constant.

As described above, the same effect as that obtained in the first embodiment can be attained by use of the output buffer according to the present embodiment.

Further, in the output buffer according to the present embodiment, the output buffer can be controlled by an inverted switching signal obtained by use of inverters as is explained in the second embodiment, and in this case, the same effect as that obtained in the second embodiment can be attained.

Next, a semiconductor integrated circuit according to a fourth embodiment of the present invention is explained with reference to FIG. 7. FIG. 7 is a circuit diagram showing a semiconductor integrated circuit including an output buffer.

As shown in FIG. 7, an output buffer 40 includes n-channel MOS transistors 21, 22, p-channel MOS transistors 31, 32, and capacitor elements 23, 33. The MOS transistor 21 has a gate connected to a node A1, a drain connected to an output node OUT3 of the output buffer 40 and a source. The MOS transistor 22 has a gate connected to an input node IN3, a source connected to a ground potential and a drain connected to the source of the MOS transistor 21. The capacitor element 23 has one end connected to the gate of the MOS transistor 21 and the other end connected to the gate of the MOS transistor 22. The transistor 31 has a gate connected to a node A2, a drain connected to the output node OUT3 of the output buffer 40 (the drain of the MOS transistor 21) and a source. The MOS transistor 32 has a gate connected to the input node IN3, a source connected to a power supply potential VCC and a drain connected to the source of the MOS transistor 31. The capacitor element 33 has one end connected to the gate of the MOS transistor 31 and the other end connected to the gate of the MOS transistor 32.

The output node OUT3 of the output buffer 40 is connected to one end of a load element 24 and the other end of the load element is connected to power supply voltage V2 (=VCC/2). Capacitors 25, 35 are mirror capacitors parasitically existing between the gates and drains of the MOS transistors 21, 31.

Next, the operation of the output buffer 40 with the above construction is explained. The potentials of the nodes A1, A2 are fixed at internal voltages V1, V3, respectively. Therefore, the MOS transistors 21, 31 are set in the ON state. The input node IN3 is supplied with a switching signal of "High" or "Low" level. The output level of the output buffer 40 is switched according to the level of the switching signal. Specifically, when the switching signal is set at the "Low" level, the MOS transistor 22 is set into the OFF state and the MOS transistor 32 is set into the ON state. Therefore, an output of the output node OUT3 is set to the "High" level. On the other hand, when the switching signal is set at the "High" level, the MOS transistor 22 is set into the ON state and the MOS transistor 32 is set into the OFF state. Therefore, the output of the output node OUT3 is set to the "Low" level.

As is explained in the first and third embodiments, in the output buffer constructed by the n-channel MOS transistors, a variation in the gate potential occurs due to the coupling of the mirror capacitor 25 when the output of the output node OUT3 is inverted from the "High" level to the "Low" level. Further, in the output buffer constructed by the p-channel MOS transistors, a variation in the gate potential occurs due to the coupling of the mirror capacitor 35 when the output of the output node OUT3 is inverted from the "Low" level to the "High" level.

However, according to the present embodiment, a variation in the gate potential (node A1) of the MOS transistor 21 due to the coupling of the mirror capacitor 25 of the MOS transistor 21 is canceled by the coupling of the capacitor element 23. Further, a variation in the gate potential (node A2) of the MOS transistor 31 due to the coupling of the mirror capacitor 35 of the MOS transistor 31 is canceled by the coupling of the capacitor element 33.

As a result, the potential levels of the respective output levels of the output node OUT3 can be kept substantially constant irrespective of whether the output of the output node OUT3 is set at the "High" level or "Low" level.

The output buffer according to the present embodiment can constitute a clocked inverter by respectively supplying a clock signal and an inverted clock signal to the nodes A1, A2. Even when the thus constructed clocked inverter is driven by use of a high frequency clock, the output potential and output timing corresponding to the output level of the output node OUT3 can be kept constant in each cycle.

Figure 8:
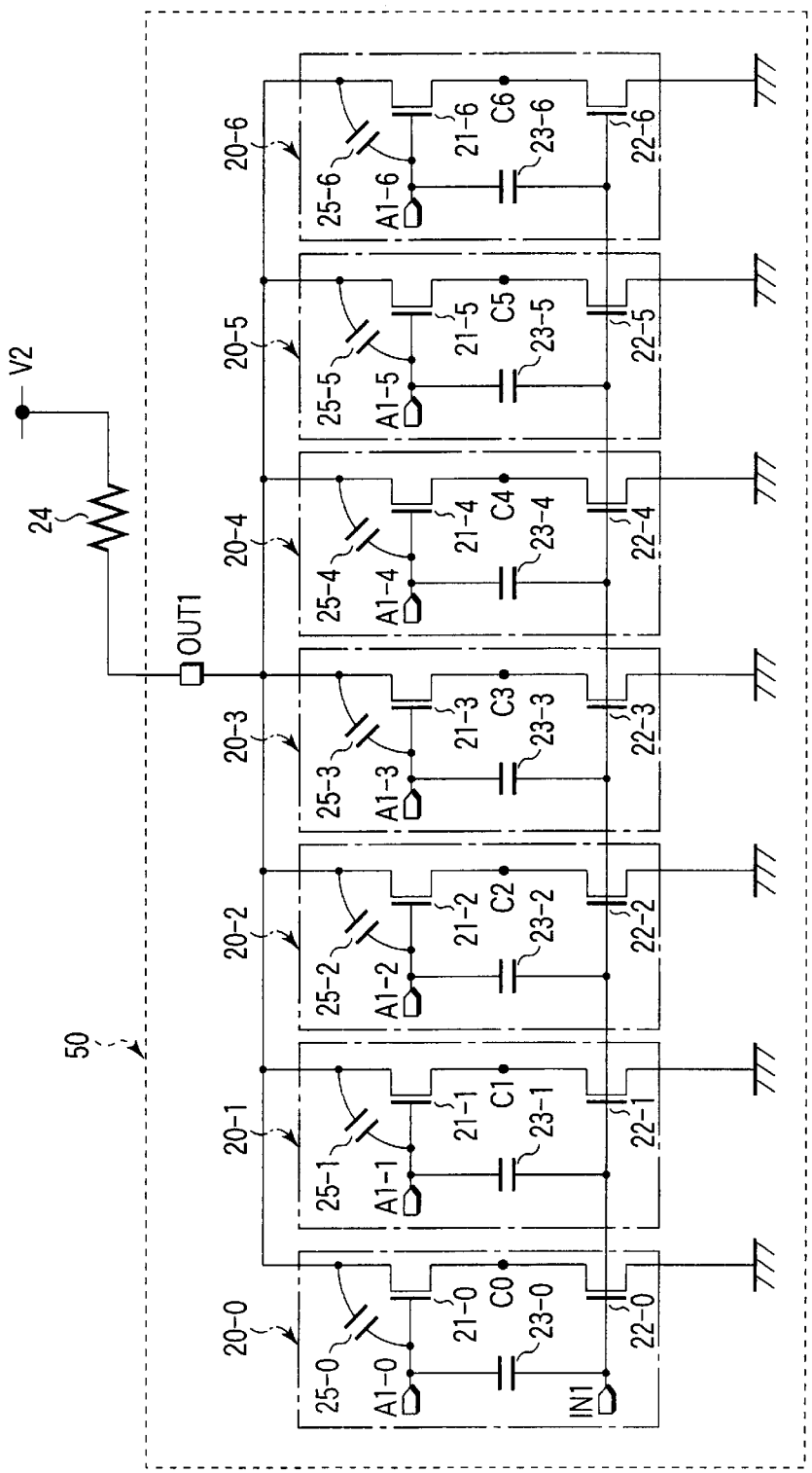
FIG. 8 is a circuit diagram showing a semiconductor integrated circuit according to a fifth embodiment of the present invention.

Next, a semiconductor integrated circuit according to a fifth embodiment of the present invention is explained with reference to FIG. 8. FIG. 8 is a circuit diagram showing a semiconductor integrated circuit including output buffers.

As shown in FIG. 8, an output buffer group 50 includes seven output buffers 20-0 to 20-6. Output nodes of the output buffers 20-0 to 20-6 are commonly connected (node OUT1).

The output buffers 20-0 to 20-6 respectively include n-channel MOS transistors 21-0 to 21-6, 22-0 to 22-6 and capacitor elements 23-0 to 23-6. The MOS transistors 21-0 to 21-6 have gates respectively connected to nodes A1-0 to A1-6, drains connected to the output node OUT1 and sources. The MOS transistors 22-0 to 22-6 have gates connected to an input node IN1, sources connected to a ground potential and drains respectively connected to the sources of the MOS transistors 21-0 to 21-6. The capacitor elements 23-0 to 23-6 have one-side ends respectively connected to the gates of the MOS transistors 21-0 to 21-6 and the other ends respectively connected to the gates of the MOS transistors 22-0 to 22-6.

The output node OUT1 of the output buffers 20-0 to 20-6 is connected to one end of a load element 24 and the other end of the load element is connected to power supply voltage V2. Capacitors 25-0 to 25-6 are mirror capacitors parasitically existing between the gates and drains of the MOS transistors 21-0 to 21-6. Further, the channel widths W0 to W13 of the MOS transistors 21-0 to 21-6 and 22-0 to 22-6 are set in the following relation. W1=W0×2, W2=W1×2, W3=W2×2, W4=W3×2, W5=W4×2, W6=W5×2, W7=W6×2, W8=W7×2, W9=W8×2, W10=W9×2, W11=W10×2, W12=W11×2, W13=W12×2.

Next, the operation of the output buffer group 50 is explained. The operations of the individual output buffers 20-0 to 20-6 are the same as that explained in the first embodiment. An output level of the output node OUT1 is controlled by applying the internal potential V1 to all or at least one of the nodes A1-0 to A1-6 and supplying a switching signal to the input node IN1.

According to the above semiconductor integrated circuit, since the channel widths of the MOS transistors 21-0 to 21-6 are different, the total current amount flowing in the output node OUT1 can be controlled in a binary fashion by selecting at least one of the nodes A1-0 to A1-6.

Generally, the current amount flowing in the MOS transistor varies by various factors, such as temperature, even if the gate potential is kept constant. However, with the construction according to the present embodiment, the current amount can be kept constant irrespective of the factors, such as temperature, by adequately selecting the nodes A1-0 to A1-6.

Further, the capacitor elements 23-0 to 23-6 are provided between the nodes A1-0 to A1-6 and the input node IN1. Therefore, the influence caused by the coupling of the mirror capacitors 25-0 to 25-6 when the output level of the output node OUT1 is changed from the "High" level to the "Low" level can be canceled by use of the capacitor elements 23-0 to 23-6. As a result, the output level and output timing of the output node OUT1 can be made constant in each cycle.

In the above embodiment, the capacitor elements 23-0 to 23-6 are respectively provided between the nodes A1-0 to A1-6 and the input node IN1. However, all of the capacitor elements are not always necessary. If the capacitor element is provided in the MOS transistor having a large channel width, particularly, in the MOS transistor having a large current supplying ability, a sufficiently large effect can be attained.

Further, in the output buffers 20-0 to 20-6, some or all of the connection nodes (nodes C0 to C6) of the MOS transistors 21-0 to 21-6 and the MOS transistors 22-0 to 22-6 may be commonly connected. By selectively connecting the nodes C0 to C6 to one another, the total current amount which can be supplied by the output buffer group 50 can be set not only in a binary fashion but also in other fashions.

Figure 9:
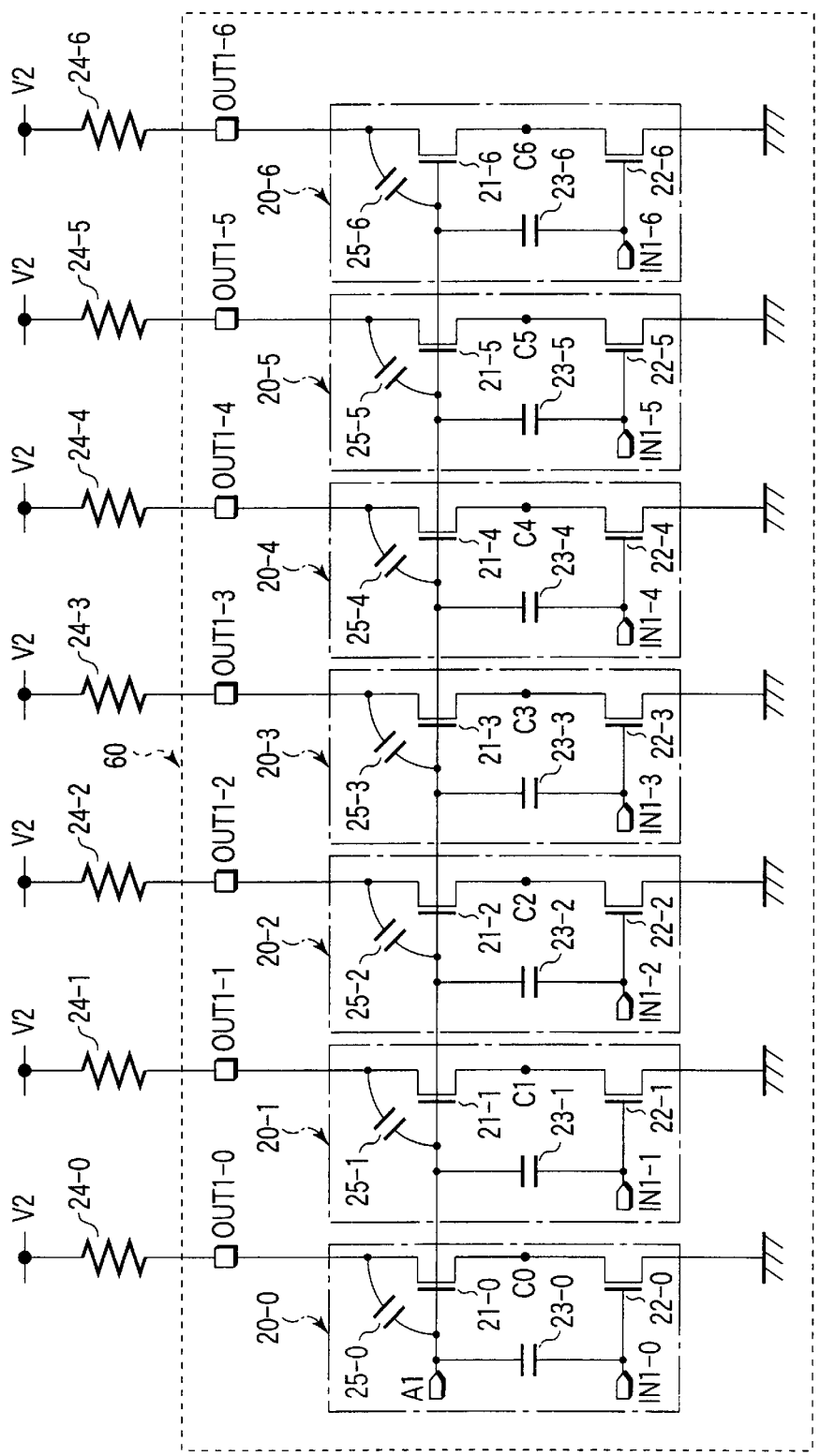
FIG. 9 is a circuit diagram showing a semiconductor integrated circuit according to a sixth embodiment of the present invention.

Next, a semiconductor integrated circuit according to a sixth embodiment of the present invention is explained with reference to FIG. 9. FIG. 9 is a circuit diagram showing a semiconductor integrated circuit.

As shown in FIG. 9, an output buffer group 60 includes seven output buffers 20-0 to 20-6 having the same construction as that shown in FIG. 2A. The output buffers 20-0 to 20-6 respectively include n-channel MOS transistors 21-0 to 21-6, 22-0 to 22-6 and capacitor elements 23-0 to 23-6. The MOS transistors 21-0 to 21-6 have gates commonly connected to a node A1, drains respectively connected to output nodes OUT1-0 to OUT1-6 and sources. The MOS transistors 22-0 to 22-6 have gates respectively connected to input nodes IN1-0 to IN1-6, sources connected to a ground potential and drains respectively connected to the sources of the MOS transistors 21-0 to 21-6. The capacitor elements 23-0 to 23-6 have one-side ends respectively connected to the gates of the MOS transistors 21-0 to 21-6 and the other ends respectively connected to the gates of the MOS transistors 22-0 to 22-6. Further, the output nodes OUT1-0 to OUT1-6 are respectively connected to one-side ends of load elements 24-0 to 24-6. The other ends of the load elements 24-0 to 24-6 are connected to a power supply potential V2. In addition, the input nodes IN1-0 to IN1-6 are respectively supplied with independent switching signals.

The output buffers 20-0 to 20-6 output independent data items respectively held therein at the same timing. Since the operations of the individual output buffers are the same as those explained in the first embodiment, the explanation thereof is omitted.

Figure 1B:
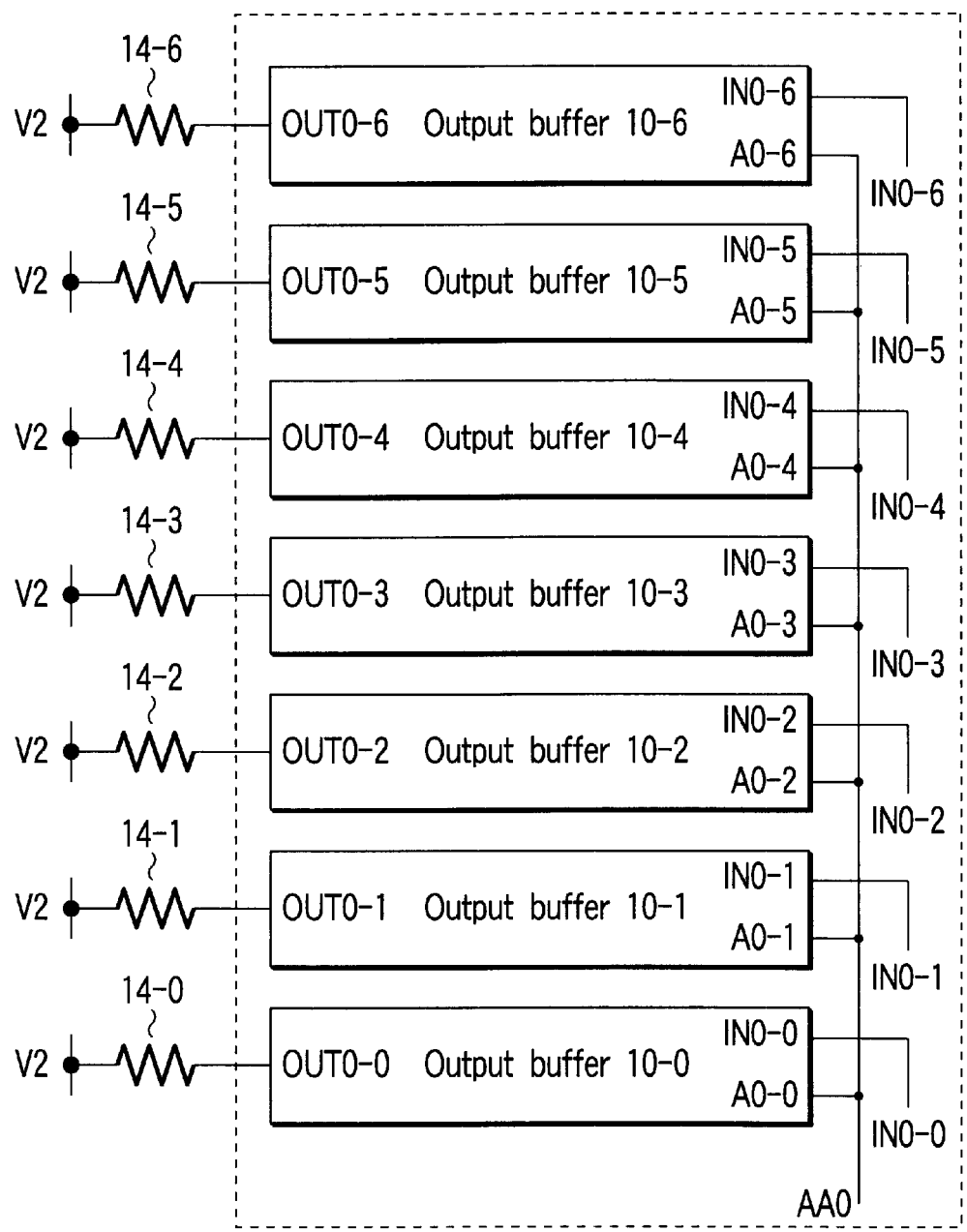

Like the first embodiment, according to the semiconductor integrated circuit with the above construction, the influence of the couplings of the mirror capacitors 25-0 to 25-6 provided in the output buffers 20-0 to 20-6 can be canceled by the couplings of the capacitor elements 23-0 to 23-6. This is explained in comparison with a case of the conventional construction shown in FIG. 1B. FIG. 10A is a waveform diagram showing output waveforms of the input nodes IN0-0 to IN0-6, output nodes OUT0-0 to OUT0-6 and common node AA0 in the output buffer shown in FIG. 1B and shows a case wherein outputs of all of the output nodes OUT0-0 to OUT0-6 rapidly change in the order of "High", "High", "Low", "High", "Low" level.

First, assume that all of the switching signals input to the input nodes IN0-0 to IN0-6 rise from the "Low" level to the "High" level at time t1. In response to this, the output signals of the output nodes OUT0-0 to OUT0-6 of all of the output buffers 10-0 to 10-6 fall from the "High" level to the "Low" level at time t2. Then, the couplings of the mirror capacitors in all of the output buffers 10-0 to 10-6 act to lower the potential of the common node AA0. Thus, the potential of the common node AA0 is influenced by the couplings of the seven mirror capacitors and significantly lowered. As a result, the potentials of the output nodes OUT0-0 to OUT0-6 in a time period t3 to t5 will be set to values extremely larger than the set values.

Figure 10B:
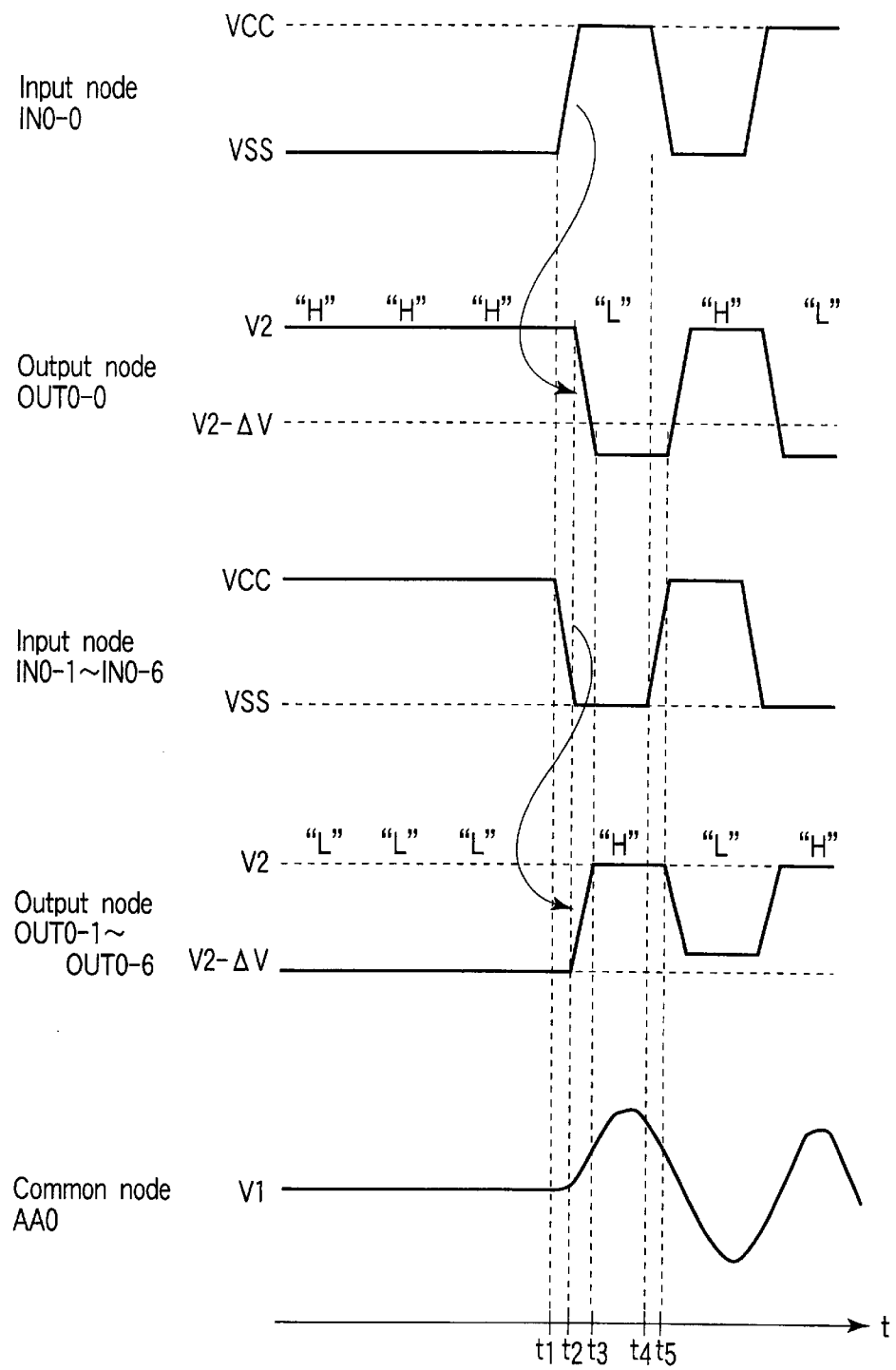

FIG. 10B is a waveform diagram showing signal waveforms of the input node IN0-0, output node OUT0-0, input nodes IN0-1 to IN0-6, output nodes OUT0-1 to OUT0-6 and common node AA0 in a case where only the output buffer 10-0 outputs data in the order of "High", "High", "High", "Low", "High", "Low" level and the output buffers 10-1 to 10-6 output data in the order of "Low", "Low", "Low", "High", "Low", "High" level.

First, the switching signal input to the input node IN0-0 changes from the "Low" level to the "High" level and the switching signals input to the input nodes IN0-1 to IN0-6 change from the "High" level to the "Low" level at time t1. Then, the output level of the output node OUT0-0 changes from the "High" level to the "Low" level and the output levels of the output nodes OUT0-1 to OUT0-6 change from the "Low" level to the "High" level at time t2.

A change in the potential of the common node AA0 at this time is explained.

First, the coupling of the mirror capacitor in the output buffer 10-0 which outputs the "Low" level acts to lower the potential of the common node AA0. On the other hand, the couplings of the mirror capacitors in the output buffers 10-1 to 10-6 which output the "High" level act to raise the potentials of the nodes A0-1 to A0-6. As a result, the influence of the couplings of the mirror capacitors in the output buffers 10-1 to 10-6 becomes dominant in the common node AA0. Therefore, the potential of the common node AA0 becomes higher than the internal potential V1. Thus, since the potential of the common node AA0 becomes higher than the internal potential V1, the potential ("Low" level) of the output signal of the output buffer 10-0 in a time period t3 to t5 becomes extremely lower than a set output level (V2–ΔV) which is set when the potential of the common node AA0 is set at the internal potential V1.

As described above, there occurs a phenomenon that the potential levels of the "Low" level are different in a case where the output patterns of all of the output buffers are the same and where they are different. At the same time, there occurs a phenomenon that time required for the output signal of the output node to change from the "High" level to the "Low" level is changed depending on the potential of the common node AA0. The phenomenon is a problem generally and commonly occurring in semiconductor devices operated by high frequency clocks.

Figure 11B:
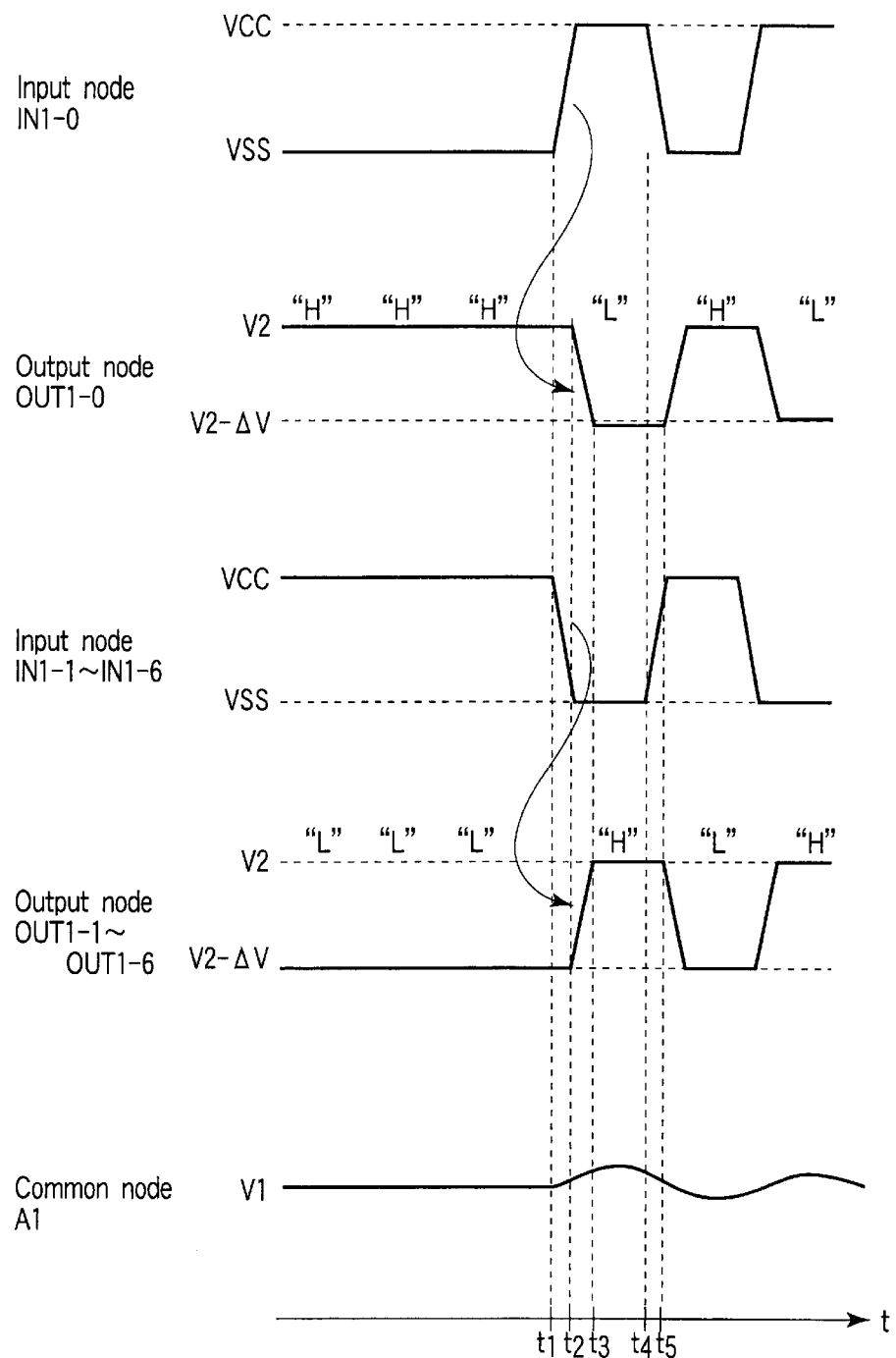

However, with the construction according to the present embodiment, the above problem can be solved. This is explained with reference to FIG. 11A and FIG. 11B. FIG. 11A is a waveform diagram showing waveforms of the input nodes IN1-0 to IN1-6, output nodes OUT1-0 to OUT1-6 and common node A1 in the output buffers shown in FIG. 9 and shows a case wherein outputs of all of the output nodes OUT1-0 to OUT1-6 rapidly change in the order of "High", "High", "Low", "High", "Low" level. FIG. 11B is a waveform diagram showing signal waveforms of the input node IN1-0, output node OUT1-0, input nodes IN1-1 to IN1-6, output nodes OUT1-1 to OUT1-6 and common node A1 in a case where only the output buffer 20-0 outputs data in the order of "High", "High", "High", "Low", "High", "Low" level and the output buffers 20-1 to 20-6 output data in the order of "Low", "Low", "Low", "High", "Low", "High" level.

AS is explained with reference to FIG. 9, in the output buffers 20-0 to 20-6 of the present embodiment, the influence caused by the couplings of the mirror capacitors 25-0 to 25-6 can be canceled by the couplings of the capacitor elements 23-0 to 23-6. Therefore, a change in the potential of the node A1 when the output signals of all of the output nodes OUT1-0 to OUT1-6 change from the "High" level to the "Low" level is extremely small. Since the potential change is extremely small, the potential of the node A1 returns to the internal potential V1 in a short period of time. As a result, as shown in FIG. 11A, the potential levels of the Low" level output to the output nodes OUT1-0 to OUT1-6 are made constant at the high frequency operation time of the output buffers. Further, at this time, the through rate of the output waveforms becomes constant.

Next, a case wherein only the output node OUT1-0 outputs a signal different from the signals from the output nodes OUT1-1 to OUT1-6 is explained. In this case, like the case of the conventional construction, the couplings of the mirror capacitors 25-1 to 25-6 provided in the output buffers 20-1 to 20-6 dominantly give an influence to the node A1. However, as described before, the influence caused by the couplings of the mirror capacitors 25-0 to 25-6 in the output buffers 20-0 to 20-6 can be canceled by the couplings of the capacitor elements 23-0 to 23-6. Therefore, the couplings of the seven mirror capacitors 25-0 to 25-6 will not substantially give an influence to the node A1. As a result, the potential ("Low" level) of the output signal of the output buffer 20-0 in the time period t3 to t5 becomes approximately equal to a set output level (V2−ΔV) which is set when the potential of the common node A1 is set at the internal potential V1.

Thus, the potential level of the output signal at the "Low" level in a case where only one of the output nodes OUT1-0 to OUT1-6 outputs a signal different from the signals from the remaining output nodes can always be kept substantially constant.

Figure 12:
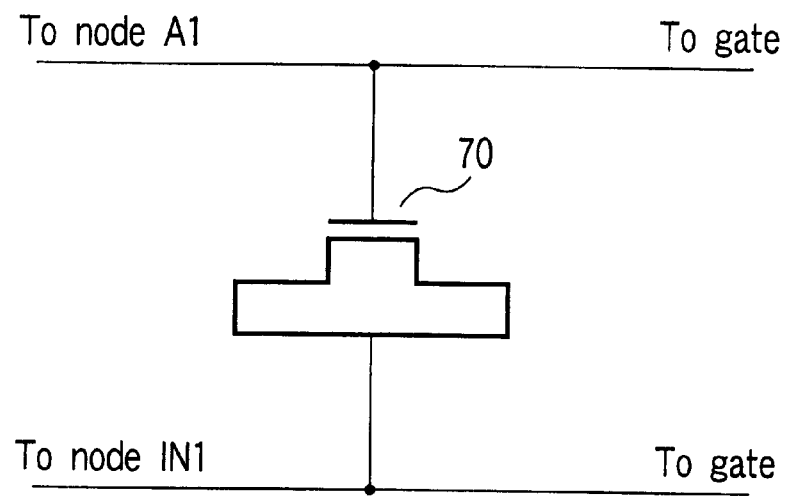
FIG. 12 is an equivalent circuit diagram of a capacitor element.

As explained in the first to sixth embodiments, according to the embodiments of this invention, the capacitor element is connected between the gate of the MOS transistor and the node whose potential changes in a complementary fashion with respect to the drain potential of the MOS transistor. The influence caused by the coupling of the mirror capacitor parasitically existing between the gate and drain of the MOS transistor can be canceled by the coupling of the capacitor element. Therefore, the output level and output timing of the MOS transistor can always be made constant. Further, when practicing the present embodiments, it is only required to provide a capacitor element between the gate of a MOS transistor and a node whose potential changes in a complementary fashion with respect to the drain potential of the MOS transistor. Therefore, the present embodiments can be extremely easily practiced and an increase in the layout area can be suppressed to minimum. As the capacitor element, for example, a MOS transistor with the construction shown in FIG. 12 can be used. AS shown in FIG. 12, one MOS transistor 70 having a gate and a source and drain which are connected together can be used as a capacitor element. The capacitance of the capacitor element can be easily controlled by adequately changing the size of the MOS transistor 70.

In the MOS transistor 70 shown in FIG. 12, the gate is connected to the node A1 (i.e., input note A2 shown in FIG. 6A), and the source-drain path is connected to the node IN1 (i.e., input node IN2 in FIG. 6A). Nonetheless, the gate may be connected to the input note IN1, and the source-drain path may be connected to the note A1. In the MOS transistor 70, the back gate may be set at the same potential as the source-drain path or at a potential different from that of the source-drain path. Moreover, the source may be connected to the node A1 or the input node IN1 and the drain may be held in a floating state, or vice versa. It is desired that the gate area of the MOS transistor 70 be smaller than the gate area of the MOS transistor 21 (i.e., MOS transistor 31 shown in FIG. 6A). In other words, the MOS structure of the transistor 70 should better have a capacitance smaller than that of the MOS structure of the transistor 21.

In the drawings used for explaining the first to sixth embodiments, a resistor element is shown as an example of the load element connected to the output node OUT. However, the load element is not limited to the resistor element and, for example, a diode or one of various types of transistors can be used as the load element. Further, the output buffers according to the fifth and sixth embodiments are constructed by the n-channel MOS transistors, but they can be constructed by use of p-channel MOS transistors like the construction according to the third embodiment or they can be constructed by use of both of n-channel and p-channel MOS transistors like the construction according to the fourth embodiment. Further, the output buffer explained in each of the above embodiments can be widely applied to not only the semiconductor memory but also a device operated on a high frequency clock.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first MOS transistor having a drain connected to an output terminal, a gate and a source, the gate of said first MOS transistor being applied with voltage not lower than a threshold voltage of said first MOS transistor;
   a second MOS transistor having a gate supplied with a switching signal used for controlling an output level of the-output terminal, a drain connected to the source of said first MOS transistor and a source, said second MOS transistor having the same conductivity type as said first MOS transistor;
   a first capacitor having one electrode connected to the gate of said first MOS transistor and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor; and
   a first inverter having an input terminal connected to the gate of said second MOS transistor and an output terminal connected to the other electrode of said first capacitor.

2. A semiconductor integrated circuit comprising:
   a first MOS transistor having a drain connected to an output terminal, a gate and a source, the gate of said first MOS transistor being applied with voltage not lower than a threshold voltage of said first MOS transistor;
   a second MOS transistor having a gate supplied with a switching signal used for controlling an output level of the output terminal, a drain connected to the source of said first MOS transistor and a source, said second MOS transistor having the same conductivity type as said first MOS transistor;

a first capacitor having one electrode connected to the gate of said first MOS transistor and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor;

a third MOS transistor having a drain connected to the drain of said first MOS transistor, a gate and a source, said third MOS transistor having a conductivity type opposite to the conductivity type of said first and second MOS transistors and the gate of said third MOS transistor being applied with a voltage not lower than threshold voltage of said third MOS transistor;

a fourth MOS transistor having a gate connected to the gate of said second MOS transistor, a drain connected to the source of said third MOS transistor and a source, said fourth MOS transistor having the same conductivity type as said third MOS transistor; and a second capacitor having one electrode connected to the gate of said third MOS transistor and the other electrode connected to a second node whose potential changes in a complementary fashion with respect to the drain potential of said third MOS transistor, said second capacitor functioning to cancel out an influence, caused by the coupling of a mirror capacitor existing between the gate and drain of said third MOS transistor, affecting the gate potential of said third MOS transistor.

3. The semiconductor integrated circuit according to claim 2, wherein the gate of said fourth MOS transistor is connected to the second node.

4. The semiconductor integrated circuit according to claim 2, further comprising a second inverter having an input terminal connected to the gate of said fourth MOS transistor and an output terminal connected to the other electrode of said second capacitor.

5. A semiconductor integrated circuit comprising:

a plurality of output buffers each including a first MOS transistor having a drain connected to an output terminal, a gate and a source, the gate of said first MOS transistor being applied with voltage not lower than threshold voltage of said first MOS transistor, and a second MOS transistor having a gate supplied with a switching signal used for controlling an output level of the output terminal, a drain connected to the source of said first MOS transistor and a source and having the same conductivity type as said first MOS transistor;

a first capacitor having one electrode connected to the gate of said first MOS transistor of at least one of said output buffers and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor; and a first inverter having an input terminal connected to the gate of said second MOS transistor and an output terminal connected to the other electrode of said first capacitor.

6. The semiconductor integrated circuit according to claim 5, wherein said first and second MOS transistors of each of said output buffers have different channel widths for each of said output buffers.

7. The semiconductor integrated circuit according to claim 5, wherein a connection node of the source of said first MOS transistor and the drain of said second MOS transistor in at least one of said output buffers is connected to a connection node of the source of said first MOS transistor and the drain of said second MOS transistor in a different one of said output buffers.

8. The semiconductor integrated circuit according to claim 5, wherein the gates of said first MOS transistors provided in said output buffers are applied with independent voltages and the gates of said second MOS transistors are commonly connected.

9. The semiconductor integrated circuit according to claim 5, wherein the gates of said second MOS transistors provided in said output buffers are supplied with the independent switching signals and the gates of said first MOS transistors are commonly connected.

10. A semiconductor integrated circuit comprising:

a plurality of output buffers each including a first MOS transistor having a drain connected to an output terminal, a gate and a source, the gate of said first MOS transistor being applied with voltage not lower than threshold voltage of said first MOS transistor, and a second MOS transistor having a gate supplied with a switching signal used for controlling an output level of the output terminal, a drain connected to the source of said first MOS transistor and a source and having the same conductivity type as said first MOS transistor; and a first capacitor having one electrode connected to the gate of said first MOS transistor of at least one of said output buffers and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor, wherein each of said output buffers includes a third MOS transistor having a drain connected to the drain of said first MOS transistor, a gate and a source, said third MOS transistor having a conductivity type opposite to the conductivity type of said first and second MOS transistors and the gate of said third MOS transistor being applied with voltage not lower than threshold voltage of said third MOS transistor; a fourth MOS transistor having a gate connected to the gate of said second MOS transistor, a drain connected to the source of said third MOS transistor and a source, said fourth MOS transistor having the same conductivity type as said third MOS transistor; and a second capacitor having one electrode connected to the gate of said third MOS transistor and the other electrode connected to a second node whose potential changes in a complementary fashion with respect to the drain potential of said third MOS transistor, said second capacitor functioning to cancel out an influence, caused by the coupling of a mirror capacitor existing between the gate and drain of said third MOS transistor, affecting the gate potential of said third MOS transistor.

11. The semiconductor integrated circuit according to claim 10, wherein the gate of said fourth MOS transistor is connected to the second node.

12. The semiconductor integrated circuit according to claim 10, further comprising a second inverter having an input terminal connected to the gate of said fourth MOS transistor and an output terminal connected to the other electrode of said second capacitor.

13. A semiconductor integrated circuit comprising:
- a first MOS transistor having a drain connected to an output terminal, a gate and a source, the gate of said first MOS transistor being applied with voltage not lower than a threshold voltage of said first MOS transistor;
- a second MOS transistor having a gate supplied with a switching signal used for controlling an output level of the output terminal, a drain connected to the source of said first MOS transistor and a source, said second MOS transistor having the same conductivity type as said first MOS transistor; and
- a first capacitor having one electrode connected to the gate of said first MOS transistor and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor,
- wherein said first capacitor is a fifth MOS transistor having a gate, a source and a drain connected to the source, said one electrode of the first capacitor is the gate of the fifth MOS transistor, and said other electrode of the first capacitor is a node of the source and drain of the fifth MOS transistor.

14. The semiconductor integrated circuit according to claim 13, wherein the back gate of said fifth MOS transistor is set at the same potential as the source and drain of the fifth MOS transistor.

15. The semiconductor integrated circuit according to claim 13, wherein said first MOS transistor has a gate area larger than the fifth MOS transistor.

16. A semiconductor integrated circuit comprising:
- a first MOS transistor having a drain connected to an output terminal, a gate and a source, the gate of said first MOS transistor being applied with voltage not lower than a threshold voltage of said first MOS transistor;
- a second MOS transistor having a gate supplied with a switching signal used for controlling an output level of the output terminal, a drain connected to the source of said first MOS transistor and a source, said second MOS transistor having the same conductivity type as said first MOS transistor; and
- a first capacitor having one electrode connected to the gate of said first MOS transistor and the other electrode connected to a first node whose potential changes in a complementary fashion with respect to the drain potential of said first MOS transistor, said first capacitor functioning to cancel out an influence, caused by the coupling of a mirror capacitor existing between the gate and drain of said first MOS transistor, affecting the gate potential of said first MOS transistor,
- wherein said first capacitor is a sixth MOS transistor having a gate, said one electrode of the first capacitor is the gate of the sixth MOS transistor, said other electrode of the first capacitor is one of the source and drain of the sixth transistor, and the other of the source and drain of the sixth transistor is held in a floating state.

17. The semiconductor integrated circuit according to claim 16, wherein the back gate of said sixth MOS transistor is set at the same potential as the source and drain of the sixth MOS transistor.

18. The semiconductor integrated circuit according to claim 16, wherein said first MOS transistor has a gate area larger than the sixth MOS transistor.

19. The semiconductor integrated circuit according to claim 10, wherein said first and second MOS transistors of each of said output buffers have different channel widths for each of said output buffers.

20. The semiconductor integrated circuit according to claim 10, wherein a connection node of the source of said first MOS transistor and the drain of said second MOS transistor in at least one of said output buffers is connected to a connection node of the source of said first MOS transistor and the drain of said second MOS transistor in a different one of said output buffers.

21. The semiconductor integrated circuit according to claim 10, wherein the gates of said first MOS transistors provided in said output buffers are applied with independent voltages and the gates of said second MOS transistors are commonly connected.

22. The semiconductor integrated circuit according to claim 10, wherein the gates of said second MOS transistors provided in said output buffers are supplied with the independent switching signals and the gates of said first MOS transistors are commonly connected.

* * * * *